(12) United States Patent
Khan et al.

(10) Patent No.: US 12,738,416 B2
(45) Date of Patent: Sep. 15, 2026

(54) CURRENT TRANSFORMER POLARITY VERIFICATION

(71) Applicant: Google LLC, Mountain View, CA (US)

(72) Inventors: Hammad Ahmad Khan, Leesburg, VA (US); Kei Hao, Anaheim, CA (US); Krishnanjan Gubba Ravikumar, Ashburn, VA (US)

(73) Assignee: Google LLC, Mountain View, CA (US)

( * ) Notice: Subject to any disclaimer, the term of this patent is extended or adjusted under 35 U.S.C. 154(b) by 144 days.

(21) Appl. No.: 18/738,876

(22) Filed: Jun. 10, 2024

(65) Prior Publication Data

US 2025/0322988 A1 Oct. 16, 2025

Related U.S. Application Data

(60) Provisional application No. 63/633,435, filed on Apr. 12, 2024.

(51) Int. Cl.

| | |
|---|---|
| ***H01F 38/32*** | (2006.01) |
| ***G01R 31/62*** | (2020.01) |
| ***G01R 35/02*** | (2006.01) |
| ***H01F 38/30*** | (2006.01) |
| ***H02M 3/335*** | (2006.01) |

(52) U.S. Cl.

CPC ............. *H01F 38/32* (2013.01); *G01R 31/62* (2020.01); *H01F 38/30* (2013.01); *G01R 35/02* (2013.01); *H02M 3/33571* (2021.05)

(58) Field of Classification Search

CPC ..... H01F 38/32; G01R 35/02; H02M 3/33571

See application file for complete search history.

(56) References Cited

U.S. PATENT DOCUMENTS

| | | | | |
|---|---|---|---|---|
| 6,888,709 | B2 * | 5/2005 | Princinsky | H02H 9/04 361/107 |
| 2016/0216306 | A1 * | 7/2016 | Weiher | H02H 3/165 |
| 2022/0294374 | A1 * | 9/2022 | Grøset | H02M 5/10 |

FOREIGN PATENT DOCUMENTS

| | | |
|---|---|---|
| CN | 201804072 | 4/2011 |
| CN | 203502540 | 3/2014 |
| CN | 103855686 | 6/2014 |

OTHER PUBLICATIONS

Extended European Search Report in European Appln. No. 25160067.2, mailed on Jul. 30, 2025, 9 pages.

(Continued)

*Primary Examiner* — Gary A Nash

(74) *Attorney, Agent, or Firm* — Fish & Richardson P.C.

(57) ABSTRACT

Methods, systems, and apparatus, including computer programs encoded on a computer storage medium, for verifying current transformer polarity for one or more current transformers. In one aspect, a method comprises for each input power leg of a protected device, injecting a first test current into a first primary node H1 of a respective current transformer to induce a second test current in a first secondary node S1 of the respective current transformer, determining a positive test result based on the flow of the second current, and determining a polarity verification for each of the input power legs of the protected device when a positive test result is determined for each of the one or more input legs of the protected device.

20 Claims, 8 Drawing Sheets

(56) References Cited

OTHER PUBLICATIONS

Institute of Electrical and Electronics Engineers, "IEEE Guide for Field Testing of Relaying Current Transformers," in IEEE Std C57.13.1-2017, (Revision of IEEE Std C57.13.1-2006), Oct. 2018, 1-46.

Office Action in European Appln. No. 25160067.2, mailed on Jun. 8, 2026, 8 pages.

* cited by examiner

SUBTRACTIVE POLARITY

ADDITIVE POLARITY

CURRENT TRANSFORMER POLARITY VERIFICATION

CROSS-REFERENCE TO RELATED APPLICATIONS

This application claims the benefit under 35 U.S.C. § 119(e) of priority to U.S. Application No. 63/633,435, filed on Apr. 12, 2024, the contents of which are hereby incorporated by reference.

BACKGROUND

A current transformer (CT) is a type of transformer that is used to generate an output current that is proportional to an input current. In particular, the transformer has a primary side and a secondary side, and the current in the secondary side is proportional to the current in the primary side of the transformer. A current transformer can be used to measure or monitor current in a conductor, or even control current in a conductor.

Current transformers have an additive polarity or a subtractive polarity, and the polarity is indicative of the direction of the current generated by the current transformer. Current flows in a polarity dot marking of one side of the transformer and flows out of a polarity dot marking of the other side of the transformer. The polarity of a current transformer is determined by the direction in which the coils are wound around the core of the transformer (clockwise or counterclockwise), and by which way the secondary leads are oriented. Typically, current transformers are subtractive polarity, where H1 is the primary first lead, facing the line, H2 is the primary second lead, and X1 is the secondary first lead, and which is on the same side of the transformer as the H1 primary first lead.

Knowledge of the polarity is critical when configuring the coupling of a conductor (e.g., a phase leg of a power voltage transformer) to a sensing device (e.g., a relay protection device or power monitoring device). Current transformer polarity tests are usually performed on the physical current transformer itself but does not include testing of current transformer secondary wiring that is from current transformer secondary wiring terminals to the sensing device. Additionally, conventional tests are not a comprehensive method for verification of current transformer polarity and current transformer wiring connection to the sensing device. This can lead to incorrect configurations, which, in turn, leads to numerous issues on site, ranging from incorrectly wired current transformer secondary wiring (including wrong current transformer polarity) to current transformer shorting blocks. For example, a user of the system can mistakenly forget to remove the current transformer shorting blocks prior to operating the system.

Thus, there is a need to verify current transformer polarity for current transformers in situ in an electrical system.

SUMMARY

The disclosed systems and methods verify current transformer polarity for one or more current transformers in a manner that addresses the shortcomings described above. In general, one innovative aspect of the subject matter described in this specification can be embodied in methods of verifying current transformer polarity for one or more current transformers, wherein, each of one or more phases of a protected device includes an input power leg, and each input power leg is coupled to an electronic sensor device by a respective current transformer; each respective current transformer is associated with a first primary node H1, a second primary node H2, a first secondary node S1, and a second secondary node S2, wherein the first secondary node S1 and the second secondary node S2 are connected to respective first and second nodes of the electronic sensor device, and the second primary node H2 of the respective current transformer is adjacent an input of an input power leg of the protected device; the method comprising: for each input power leg of the protected device: injecting a first test current into a first primary node H1 of the respective current transformer to induce a second test current in a first secondary node S1 of the respective current transformer, determining a positive test result when the second test current i) flows into a first node of the electronic sensor device and flows out of a second node of the electronic sensor device and ii) flows into the second secondary node S2 of the respective current transformer, and determining a negative test result otherwise; and determining a polarity verification for each of the input power legs of the protected device when a positive test result is determined for each of the one or more input power legs of the protected device. Other embodiments of this aspect include corresponding systems, apparatus, and computer programs, configured to perform the actions of the methods, encoded on computer storage devices.

In conventional systems, current transformer polarity tests are confined to the current transformer itself, neglecting a comprehensive examination of the current transformer secondary wiring (i.e., secondary side) from the wiring terminals to a protective device, such as a relay sensor device. This approach falls short of ensuring a thorough verification of current transformer polarity and the wiring connection to the protective device. Consequently, these techniques may lead to suboptimal wiring on the secondary side of the current transformer or create issues like shorting in connections. Additionally, miswiring of test equipment can result in incorrect verification and increased latency in the verification process.

Existing methods attempt to tackle this problem by verifying the polarity of the current transformer and assuming that other systems will handle the verification of the current transformer's polarity concerning the protective device. However, these techniques overlook the interplay between the polarity of the current transformer and the protective device. This oversight can result in inadequacies in the wiring from the current transformer to the protective device, incorrect or reversed polarity, and potential shorting in the connections of the current transformer, including shorting blocks.

In contrast, this specification describes techniques that allow the system to verify the polarity for each phase of a current transformer in terms of the protective device. In particular, a user can use the system to follow a methodology in order to test the connections between the phase legs of the current transformer and the protective device. The methodology can include injecting a test current into a first primary node of the respective current transformer to induce another test current in a second primary node of the respective current transformer, and the user can determine a verification result based on the flow of the other current from the nodes of the current transformer to the nodes of the protective device (e.g., test and verify the polarity of the current transformers associated with each phase and the secondary connections of the current transformers and the protective device).

Therefore, the system allows for a more comprehensive verification for current transformer polarity and wiring that takes into account the connections between the current transformer itself and the protected device. In addition, this proposed methodology is also a simpler approach than conventional techniques because this verification methodology only requires connection of certain current injection equipment to the primary side of the current transformer without requiring secondary connection of other test equipment. As such, the system can efficiently verify the polarity of the current transformer, determine whether shorting terminal blocks are present, and detect incorrect current transformer polarity or wiring.

The details of one or more embodiments of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Figure 1A:
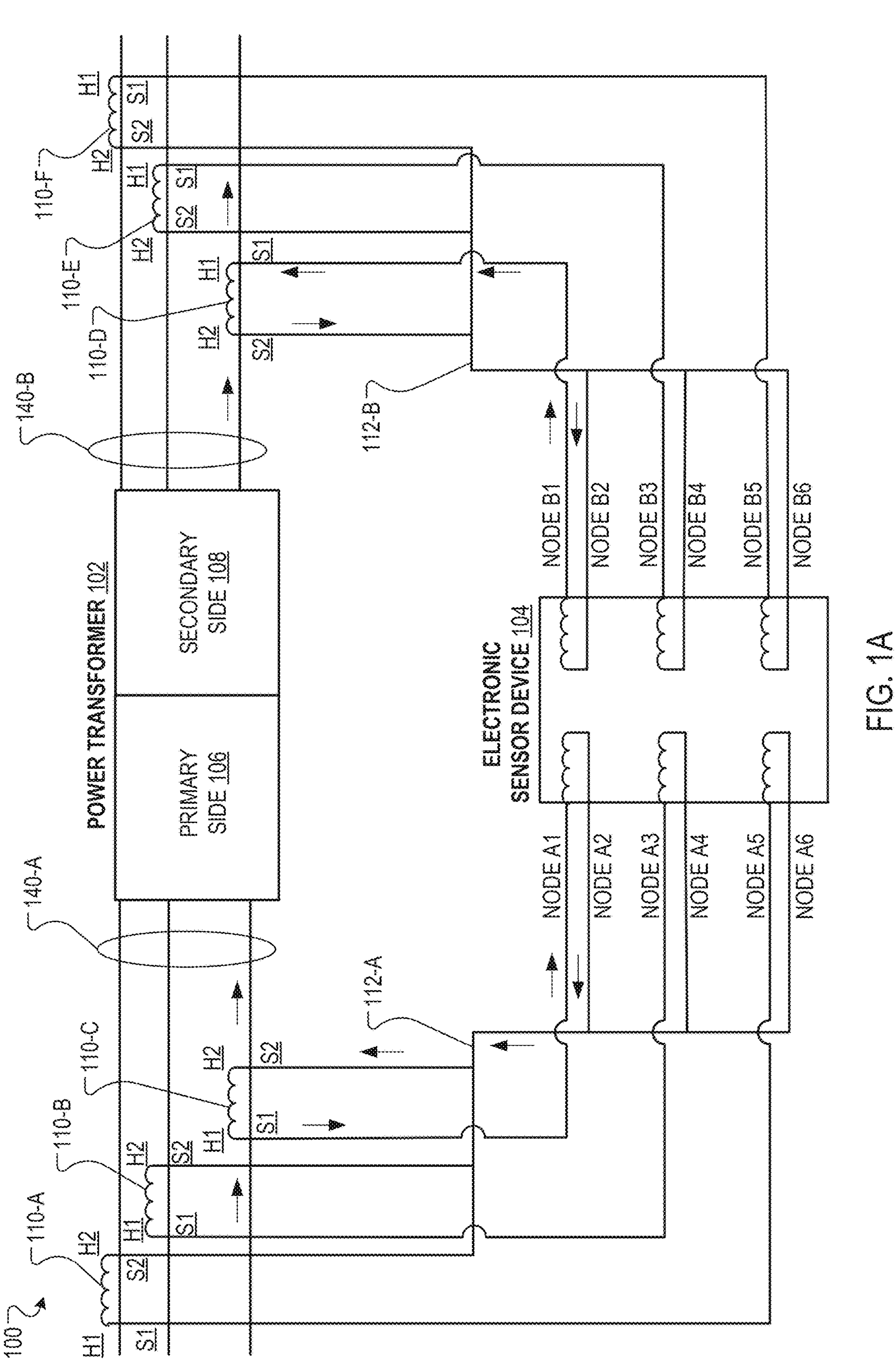
FIGS. 1A-1D are example wiring diagrams in which polarity may be verified.
Figure 1B:
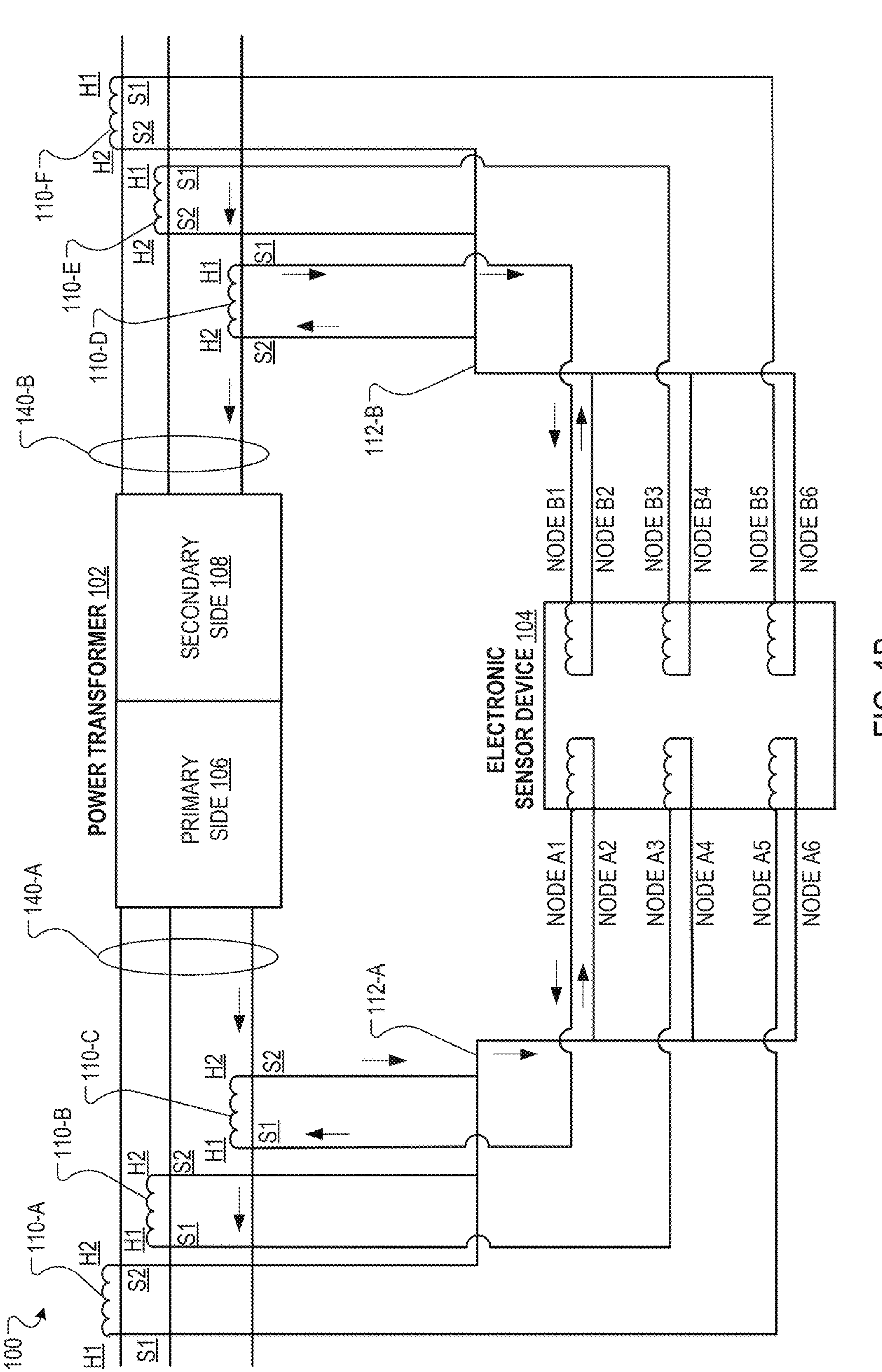

This written description describes systems and methods to verify current transformer polarity for one or more current transformers in situ in an electrical system. The current transformers are used in a protection scheme for a protected device the receives power from a bus or line. In the examples that follow, the protected device is a power transformer. However, other devices may also be protected, such as single or three-phase motors, generators, etc. Accordingly, the systems and method described herein are not limited to protection schemes for power transformers and can be used to provide protection to a variety of electrical devices.

In the power transformer example, the current transformers may be coupled to input power legs of a single or three-phase power transformer to provide monitoring currents to sensing equipment, such as a protective relay.

In one implementation, each phase of a power transformer includes a primary phase leg and a secondary phase leg, and each of the primary phase legs and the secondary phase legs is coupled to an electronic sensor device by a respective current transformer.

Each respective current transformer is associated with a first primary node H1 and a second primary node H2, and a first secondary node S1 and a second secondary node S2, wherein the first secondary node S1 and the second secondary node S2 are connected to respective first and second nodes of the electronic sensor device. The second primary node H2 of the respective current transformer is adjacent an input of the primary phase leg of the power transformer (e.g., facing the primary phase leg input of the power transformer).

For each primary phase leg of the power transformer, a first test current is injected into a first primary node H1 of the respective current transformer to induce a second test current in the first secondary node S1 of the respective current transformer. The first test current is DC current.

In general, the system can determine whether the current transformer is wired correctly into a monitoring or protection scheme based on a signature designation of a first node and a second node of the electronic sensor device. In the case of a relay, for example, for each relay terminal, the system determines whether the current flows from the first node to a second node. In some examples, an administrator can designate a positive test result (e.g., a positive signature) when current is flowing from the first node to the second node, and a negative test result (e.g., a negative signature) when the current is flowing from second node to the first node. In other examples, the administrator can designate a positive test result (e.g., a positive signature) when current is flowing from the second node to the first node, and a negative test result (e.g., a negative signature) when the current is flowing from first node to the second node. In other words, a particular current flow convention can be selected by an administrator to determine positive and negative test results.

In more specific examples, a positive test result is determined when the second test current i) flows into the first node of the electronic sensor device and flows out of the second node of the electronic sensor device and ii) flows into the second secondary node S2 of the respective current transformer. Otherwise, a negative test result is determined. Finally, a polarity verification for the primary phase legs of the transformer is determined when a positive test result is determined for each primary phase leg.

The process is also done on the secondary side of the power transformer. For each secondary phase leg, a third test current is injected into the second primary node H2 of the respective current transformer to induce a fourth test current in a second secondary node S2 of the respective current transformer. The second primary node H2 of the respective current transformer is adjacent an input of the secondary phase leg of the transformer. The third test current is DC current.

A positive test result is determined when the fourth test current i) flows into the second node of the electronic sensor device and flows out of the first node of the electronic sensor device and ii) flows into the first secondary node S1 of the respective current transformer. Otherwise, a negative test result is determined.

Finally, a polarity verification for the secondary phase legs of the transformer is determined when a positive test result is determined for each secondary phase leg.

These features and additional features are described in more detail below.

FIGS. 1A-1D are example wiring diagrams for which polarity may be verified. The figures show an example current transformer system 100. The system 100 depicts a power transformer 102 coupled to an electronic sensor device 104 (e.g., a relay system that provides protection for the power transformer 102) by current transformers 110A-110F.

The power transformer 102 has a primary side 106 and a secondary side 108. In particular, the power transformer 102 can have one or more phases (e.g., one phase or three phases) corresponding to a number of phase legs of the power transformer 102. For example, the power transformer 102 is a three-phase transformer with three primary phase legs 140-A that correspond to the primary side 106, and three secondary phase legs 140-B that correspond to the secondary side 108. The power transformer 102 can be a voltage transformer.

The electronic sensor device 104 is a sensing device configured to monitor events in a system. In particular, the electronic sensor device 104 can be used to control another device, such as a switch that can isolate one or more legs of the transformer 102 based on a sensed current using a disconnecting device, such as a circuit breaker. In some examples, the electronic sensor device 104 can function as a relay sensor (the relay switches on the primary and secondary sides of the transformer 102 are not shown to avoid congestion in the drawings). The electronic sensor device 104 has primary nodes corresponding to the primary side 106 (node A1, node A3, and node A5), secondary nodes corresponding to the primary side 106 (node A2, node A4, and node A6), primary nodes corresponding to the secondary side 108 (node B1, node B3, and node B5), and secondary nodes corresponding to the secondary side 108 (node B2, node B4, and node B6).

Each primary phase leg and each secondary phase leg of the power transformer 102 is coupled to the electronic sensor device 104 by a respective current transformer 110. The primary phase legs are coupled to the electronic sensor device 104 by current transformers 110-A, 110-B, and 110-C, and the secondary phase legs are coupled to the electronic sensor device 104 by current transformers 110-D, 110-E, and 110-F. When wired correctly, the current sensed by each of the current transformers 110 on the primary side is directed into the primary legs, towards the power transformer 102, and the current sensed by each current transformer on the secondary side is directed out of the secondary legs, away from the power transformer 102, as depicted by the flow arrows in FIG. 1A.

The current transformer 110, e.g., transformer 110-C, is a transformer configured to generate an output current that is proportional to an input current. The current transformer 110 can be a wound-type current transformer. A wound-type current transformer has both a primary winding corresponding to the primary side and secondary winding corresponding to the secondary side. In some other examples, the current transformer 200-A can be a window-type current transformer or a bar-type current transformer. In this case, the current transformer 200-A may not have a primary winding, instead the current transformer 200-A can have a laminated core.

An example current transformer 110-C is in the form of a ring (e.g., a wound-type current transformer), where one side of the ring corresponds to a first primary node H1 of the current transformer 110-C and the other side of the ring corresponds to a second primary node H2 of the current transformer 110-C. Additionally, the current transformer 110-C is associated with a first secondary node S1 and a second secondary node S2 coupled to the respective nodes A1 and A2 of the electronic sensor device 104. In some examples, such as for a wound-type current transformer, the current transformer physically has each of the nodes. In some other examples, such as for a bar-type current transformer, the current transformer is associated with each node in terms of the magnetic coupling of the current transformer.

As depicted in FIG. 1A, one of the primary phase legs of the power transformer 102 is coupled to the current transformer 110-C by first primary node H1 and second primary node H2. The current transformer 110-C, in turn, is coupled to node A1 and node A2 of the electronic sensor device 104 by the first secondary node S1 and a second secondary node S2 of the current transformer 110-C, respectively.

The other legs on the primary side 106 of the transformer 102 are coupled to the electronic sensor device 104 by current transformers 110 in a similar manner. Additionally, each second secondary node S2 of the transformers 110-A, 110-B and 110-C on the primary side of the transformer 102 are connected to a common node 112-A, as are the electronic sensor device 104 nodes A2, A4 and A6.

Likewise, a secondary phase leg is coupled to the current transformer 110-D by the first secondary node H2 and the first primary node H1. The current transformer 110-D, in turn, is coupled to node B1 and node B2 of the electronic sensor device 104 by the first secondary node S1 and the second secondary node S2 of the current transformer 110-D, respectively.

The other legs on the secondary side 108 of the transformer 102 are coupled to the electronic sensor device 104 by current transformers 110 in a similar manner. Additionally, each second secondary node S2 of the transformers 110-D, 110-E and 110-F on the secondary side of the transformer 102 are connected to a common node 112-B, as are the electronic sensor device 104 nodes B2, B4 and B6.

As such, the connections of the current transformers 110 on the primary side 106 of the transformer 102 are mirrored for the connections of the current transformers 110 on the secondary side 108.

The current transformers 110 can have an additive polarity or a subtractive polarity, where the polarity refers to the instantaneous direction of a first current with respect to a second current generated by the current transformer 110. Correct knowledge of the polarity of the current transformer 110 is critical for the coupling of the phase leg of the power transformer 102 to the electronic sensor device 104. For example, each current transformer 110 has an additive polarity or a subtractive polarity that indicates the direction of the generated current, as described in further detail below with reference to FIGS. 2A-2D.

FIG. 1A depicts a common nodes 112-A and 112-B, also referred to as "star points," connected to the second secondary nodes S2, and with a testing convention of current being injected into the first primary node H1 for transformer 110-C on the primary side 106. For the secondary side, current is injected into the H2 node of transformer 110-D and test current are monitored according to directional conventions on the secondary side 108.

Figure 1C:
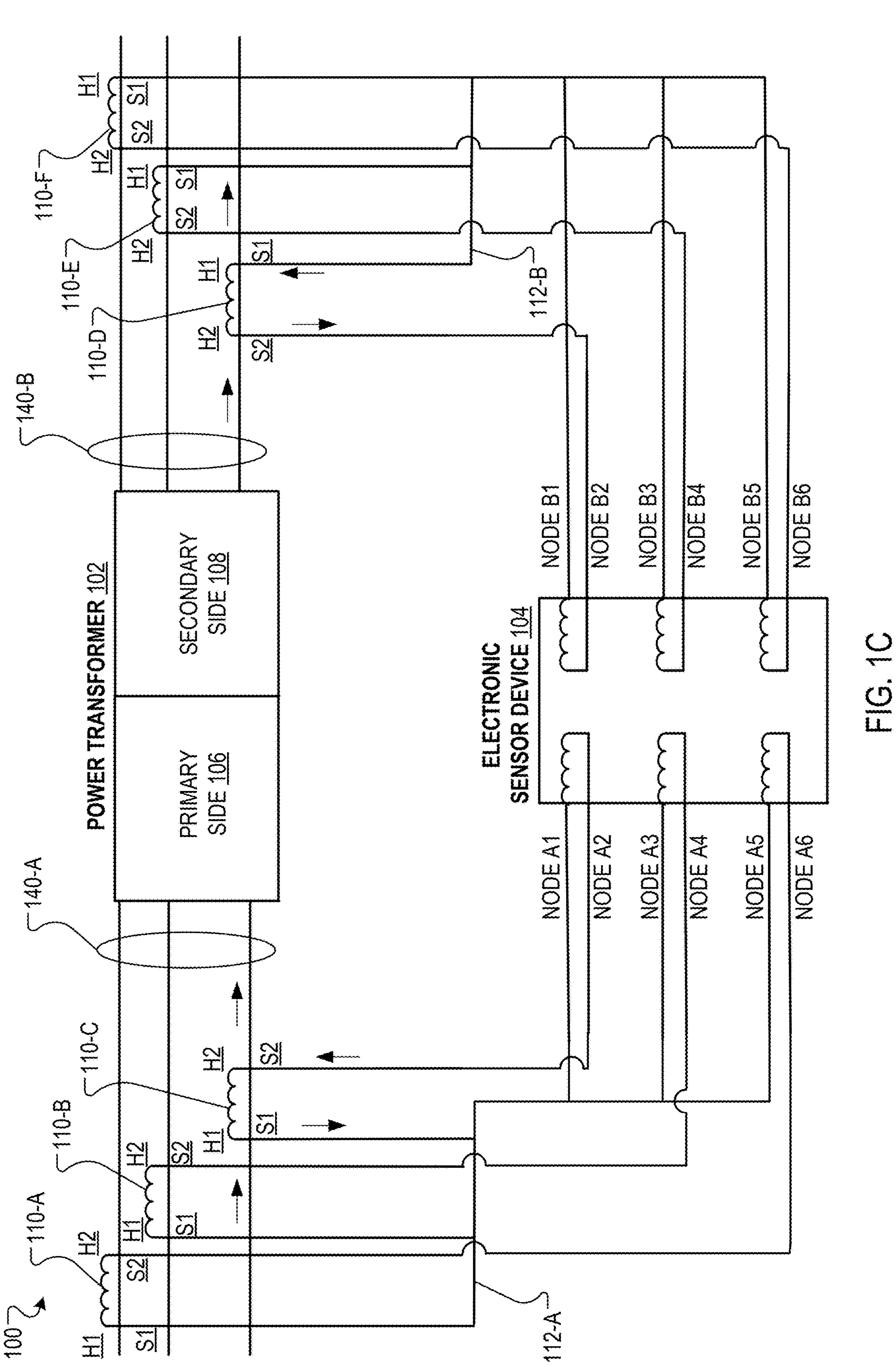
Figure 1D:
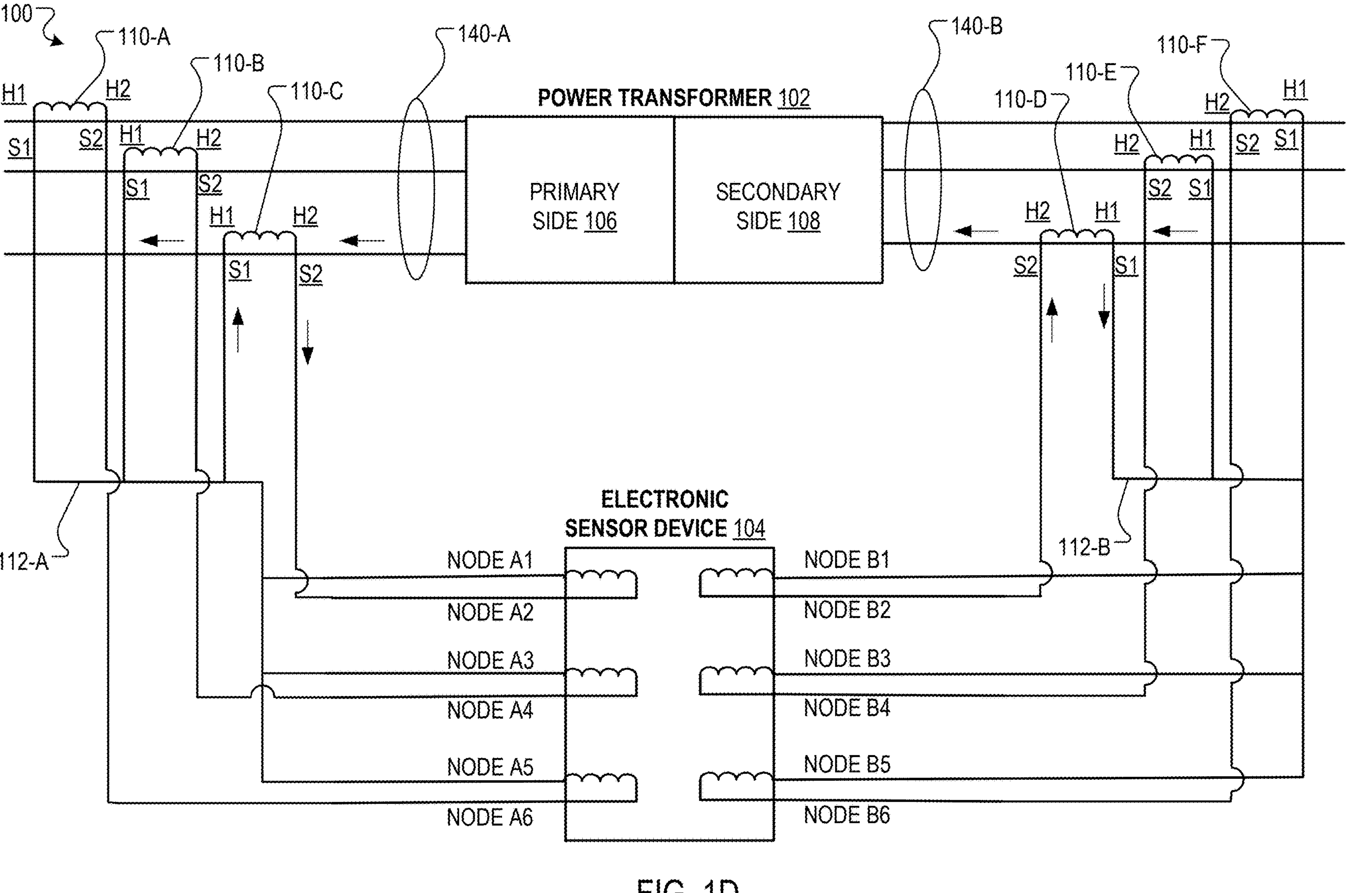

Other testing conventions can also be used. For example, in FIG. 1B, the connections are the same as in FIG. 1A, but the current conventions are reversed. Similarly in FIGS. 1C and 1D, the common nodes 112 may be respectively connected to the first secondary nodes S1 instead of the second secondary nodes S2. Likewise, current flow paths as shown in FIG. 1C or in FIG. 1D may be use for evaluation.

Figure 2A:
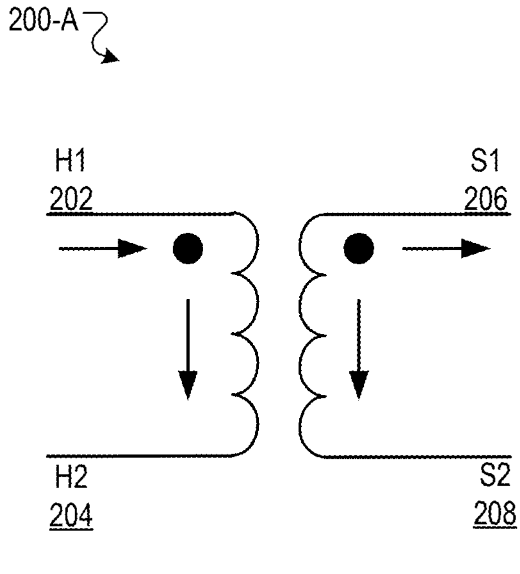
FIGS. 2A-2D are diagrams of polarities of an example current transformer system.

FIG. 2A is a diagram of subtractive polarity of a current transformer. For example, the current transformer 200-A can be the current transformer of FIG. 1A, e.g., current transformer 110-C.

The current transformer 200-A has a subtractive polarity as portrayed, and the current transformer 200-A has a first primary node H1 202 and a second primary node H2 204, a first secondary node S1 206, and a second secondary node S2 208. Subtractive polarity is the conventional polarity.

The current of the primary side of the current transformer 200-A is proportional to the current of the secondary side, where the current of the H1 202 is the input current, and the current of S1 206 is the generated output current. In particular, the current transformer 200-A generates the output current based on a gain and number of wire windings. The polarity of the current transformer is determined by the direction in which the coils are wound around the core of the transformer (clockwise or counterclockwise), and which way the nodes S1 206 and S2 208 are oriented.

In general, the current transformer has a polarity dot marking on the primary side and the secondary side, and current flows in a polarity dot marking of one side of the transformer and flows out of a polarity dot marking of the other side of the transformer. For example, since current transformer 200-A has subtractive polarity, the polarity dot marking on the primary side is on the same side as the polarity dot marking on the secondary side. In this case, first primary node H1 202 faces the line, the second primary node H2 204 faces the load, and the first secondary node S1 206 is on the same side as the first primary node H1 202.

Figure 2B:
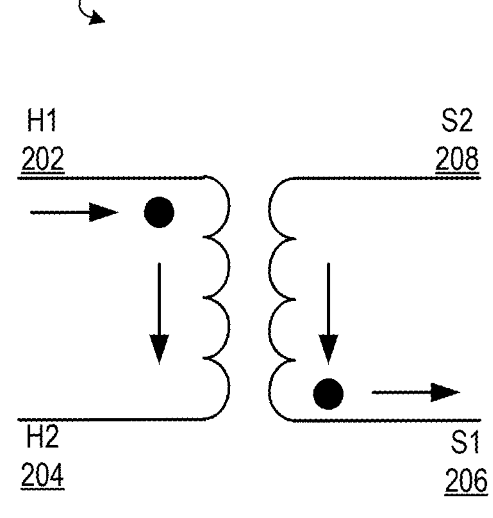

FIG. 2B is a diagram of additive polarity of a current transformer 200-B. The current transformer 200-B has a first primary node H1 202, a second primary node H2 204, a first secondary node S1 206, and a second secondary node S2 208.

Since current transformer 200-B has additive polarity, the polarity dot marking on the primary side is on the opposite side as the polarity dot marking on the secondary side. In this case, first primary node H1 202 faces the line, second primary node H2 204 faces the load, and first secondary node S1 206 is on the same side as second primary node H2 204.

Figure 2C:
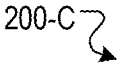
Figure 2C:
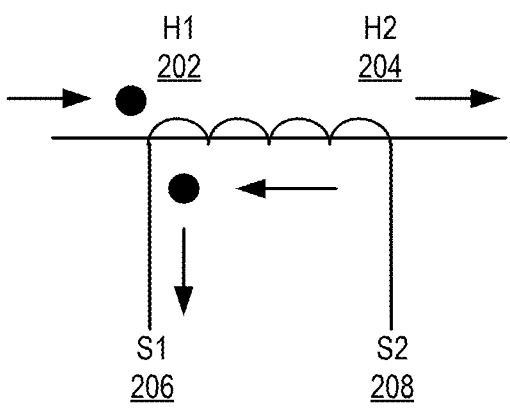

FIG. 2C is a diagram of a current transformer of a primary side of a power transformer of FIG. 1A. For example, the current transformer 200-C can be the current transformer 110-C of FIG. 1A, depicted on the primary side 106 of power transformer 102.

The current transformer 200-C has a first primary node H1 202, a second primary node H2 204, a first secondary node S1 206, and a second secondary node S2 208.

Current transformer 200-C has subtractive polarity because the polarity dot marking on the primary side is on the same side as the polarity dot marking on the secondary side. The system and method described herein can induce the test current through the current transformer 200-C through a wire placed between the H1 and node H2 to verify the polarity of the current transformer 200-C. In particular, the system injects the test current towards a protected device (e.g., the power transformer of FIG. 1A).

Figure 2D:
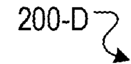
Figure 2D:
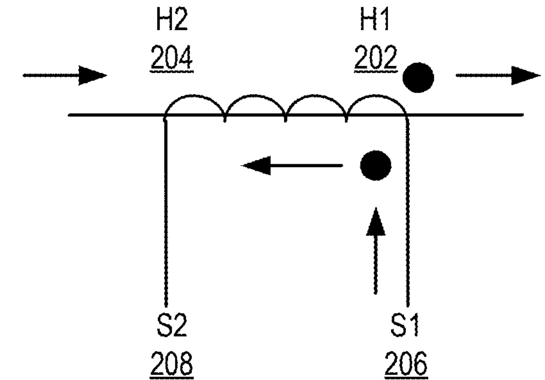

FIG. 2D is a diagram of a current transformer of a secondary side of a power transformer. For example, the current transformer 200-D can be the current transformer 110-D of FIG. 1A, depicted on the secondary side 108 of power transformer 102.

The current transformer 200-D has a first primary node H1 202, a second primary node H2 204, a first secondary node S1 206, and a second secondary node S2 208.

As shown, current transformer 200-D has subtractive polarity. The system and method described herein can induce the test current through the current transformer 200-D through a wire placed between the node H1 and the node H2 to verify the polarity of the current transformer 200-D. In particular, the system injects the test current towards the protected device.

Assuming the current transformers are wired correctly as depicted in FIG. 1A, monitoring and protective schemes will operate as designed. However, given the nature of the current transformer, and given that installers may err when correcting equipment, a polarity verification process is used to verify the connections. In particular, a process is used to verify the polarity of each current transformer 110. In particular, for each current transformer, the method to test the polarity includes inducing a test current into a node of the current transformer to verify the polarity and monitoring the current through the common connection nodes 112, as described in further detail below with reference to FIG. 3.

Figure 3:
FIG. 3 is a flow diagram of an example process for a general flow of verifying current transformer polarity.
Figure 3:
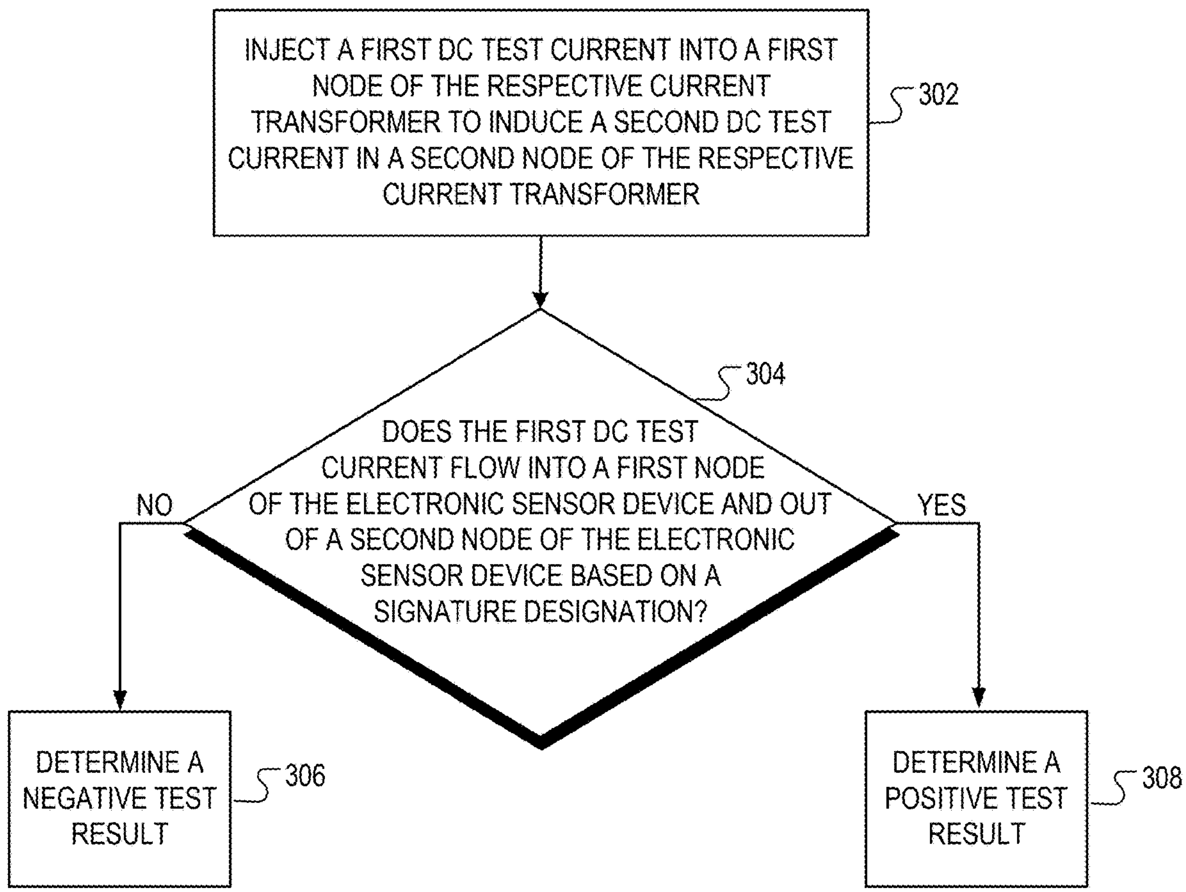

FIG. 3 is a flow diagram of an example process 300 for a general flow of verifying current transformer polarity. The process 300 can be performed by test equipment and associated computer devices. For example, in the system 100 of FIG. 1A, test equipment, e.g., current generators, monitors, and associated computer equipment, can be connected to the configured equipment depicted in FIG. 1A and the process steps can be performed.

For each current transformer, the process 300 injects a first DC test current into a first node of the current transformer to induce a second DC test current in a second node of the current transformer (302). A user can select a particular mode (e.g., a test mode) for an electronic sensor device connected to the current transformer.

The process 300 then determines whether the first DC test current flows into a first node of the electronic sensor device and out of a second node of the electronic sensor device based on a signature designation (304). The signature designation (e.g., a positive signature or a negative signature) can be defined by an administrator of the system (e.g., each node has a specified signature of current pre-programmed). For example, the administrator of the system can define the first node as A1 and the second node as A2. In some examples, the administrator can instead define the first node as A2 and the second node as A1.

The process 300 determines a negative test result if the first DC test current does not flow into the first node and out of the second node of the electronic sensor device (308). For example, the current may flow into the second node and out of the first node of the electronic sensor device, thus, indicating a negative signature and that the polarity is flipped. In this case, the electronic sensor device can output the negative test result.

The process 300 determines a positive test result if the first DC test current flows into the first node and out of the second node of the electronic sensor device (308). In this case, the current flow indicates a positive signature. The electronic sensor device can output the positive test result. In some examples, based on the test result, a user can perform degaussing of the current transformer. In particular, the user can apply another DC test current of opposite polarity as the first DC current for a particular period of time, which can reduce remanence flux in the system.

Figure 4:
FIG. 4 is a flow diagram of an example process for verifying current transformer polarity for one or more current transformers on a primary side of a transformer.
Figure 4:
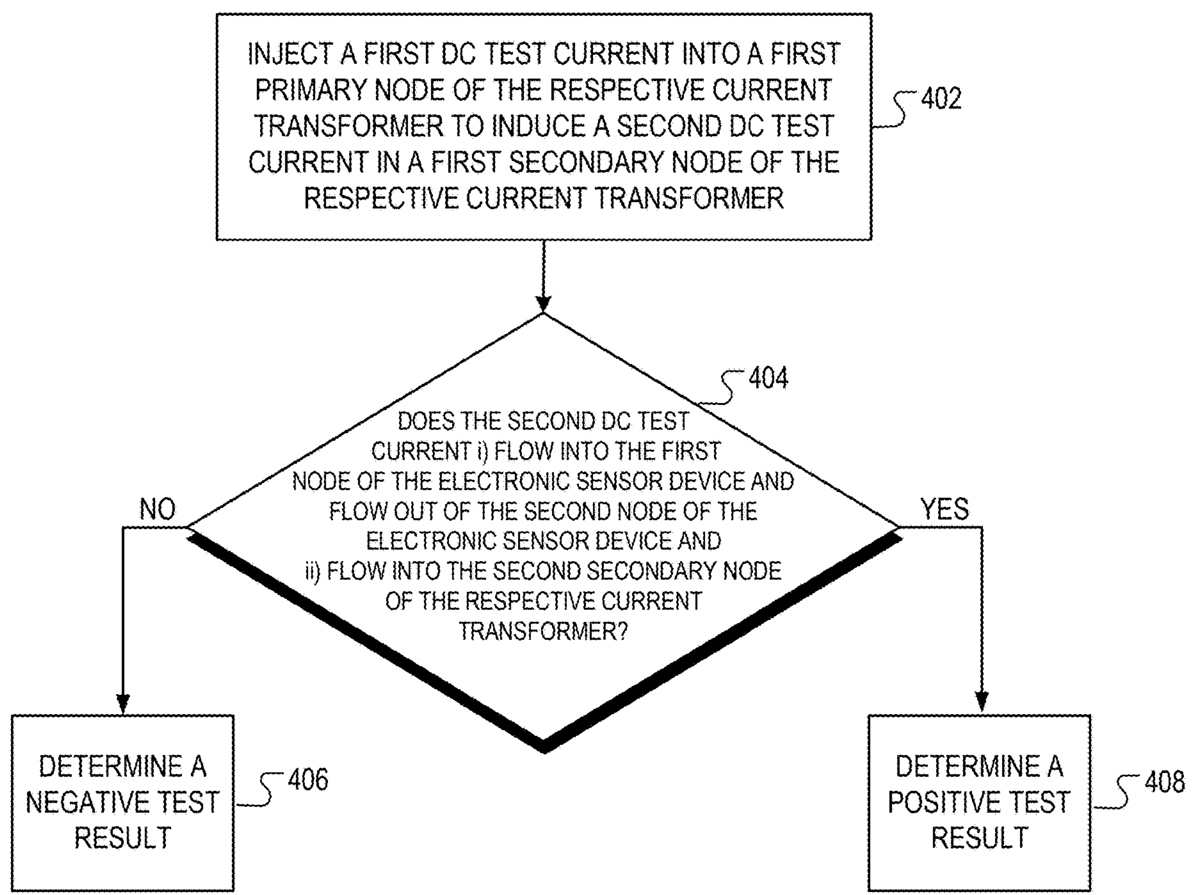

FIG. 4 is a flow diagram of an example process 400 for verifying current transformer polarity for one or more current transformers on a primary side of a transformer. The process 400 can be performed by test equipment and associated computer devices. For example, in the system 100 of FIG. 1A, test equipment, e.g., current generators, monitors, and associated computer equipment, can be connected to the configured equipment depicted in FIG. 1A and the process steps can be performed. The process 400 is done on the primary side of the power transformer for each phase leg.

The process 400 injects a first test current into a first primary node H1 of the respective current transformer to induce a second test current in the first secondary node S1 of the respective current transformer (402). For example, for each current transformer and for each primary phase leg of each phase of the power transformer, the process 400 injects a first test current into the H1 node (depicted by the arrow entering the H1 node of the current transformer 110-C) to induce a second test current in the S1 node (depicted by the arrow exiting the S1 node of current transformer 110-C).

The process 400 then determines whether the second test current i) flows into the first node of the electronic sensor device and flows out of the second node of the electronic sensor device and ii) flows into the second secondary node S2 of the current transformer (404). For example, by monitoring current sensors in the various conductors, the process 400 determines whether the second test current flows into node A1 and flows out of node A2 of FIG. 1A, and flows into the S2 node of the current transformer 110-C.

If the process 400 determines that the second test current does not i) flow into the first node of the electronic sensor device and flow out of the second node of the electronic sensor device or ii) flow into the second secondary node S2 of the current transformer, the process 400 determines a negative test result (406). The negative test result can indicate that the polarity of the current transformer is incorrect (e.g., the polarity is not a subtractive polarity) or that there is a wiring error in the connections, or that there is fault in the current transformer.

If the process 400 determines that the second test current i) flows into the first node of the electronic sensor device and flow out of the second node of the electronic sensor device and ii) flows into the second secondary node S2 of the current transformer, the system determines a positive test result (408).

The positive test result is for one phase leg of the transformer. If the transformer is a multi-phase transformer, the process is repeated for each phase leg, and if a positive result is determined for each phase leg on the primary side, then the process determines the current transformers on the primary side of the power transformer are verified.

Figure 5:
FIG. 5 is a flow diagram of an example process for verifying current transformer polarity for one or more current transformers on a secondary side of a transformer.
Figure 5:
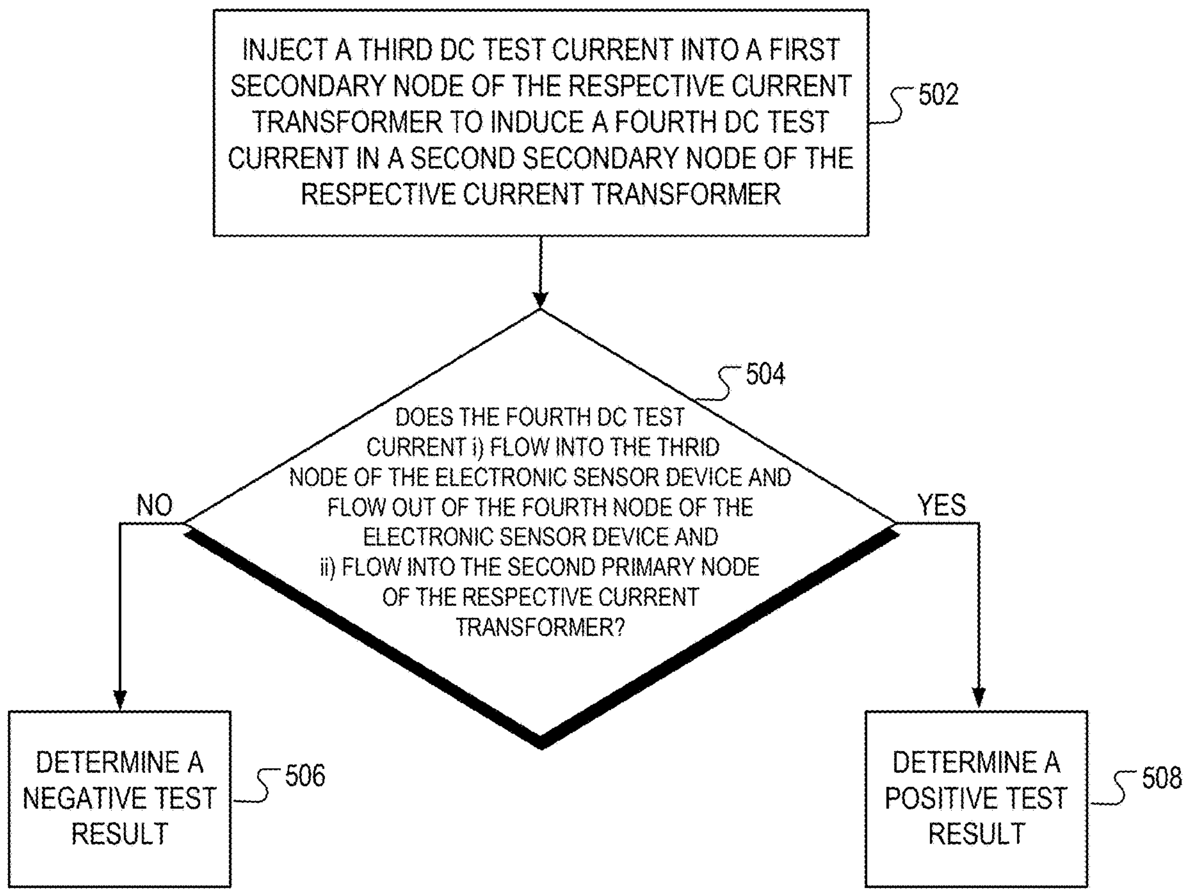

FIG. 5 is a flow diagram of an example process 500 for verifying current transformer polarity for one or more current transformers on a secondary side of a transformer. The process 500 is similar to the process 400 but mirrored for the secondary side.

The process 500 injects a third test current into a second primary node H2 of the respective current transformer to induce a fourth test current in a second secondary node S2 of the respective current transformer (502). For example, for each current transformer and for each secondary phase leg of each phase of the power transformer, the process 500 injects a third test current into the H2 node (depicted by the arrow entering the H2 node of the current transformer 110-D) to induce a fourth test current in the S2 node (depicted by the arrow exiting the S2 node of current transformer 110-D).

The process 500 then determines whether the fourth test current i) flows into the third node of the electronic sensor device and flows out of the fourth node of the electronic sensor device and ii) flows into the first secondary node S1 of the current transformer (504). For example, by monitoring current sensors in the various conductors, the process 500 determines whether the second test current flows into node B1 and flows out of node B2 of FIG. 1A, and flows into the S1 node of the current transformer 110-D.

If the process 500 determines that the second test current does not i) flow into the first node of the electronic sensor device and flow out of the second node of the electronic sensor device or ii) flow into the first secondary node S1 of the current transformer, the process 500 determines a negative test result (506). The negative test result can indicate that the polarity of the current transformer is incorrect (e.g., the polarity is not a subtractive polarity) or that there is a wiring error in the connections, or that there is fault in the current transformer.

If the process 500 determines that the second test current i) flows into the first node of the electronic sensor device and flow out of the second node of the electronic sensor device and ii) flows into the first secondary node S1 of the current transformer, the system determines a positive test result (508).

The positive test result is for one phase leg of the transformer. If the transformer is a multi-phase transformer, the process is repeated for each phase leg, and if a positive result is determined for each phase leg on the secondary side, then the process determines whether the current transformers on the secondary side of the power transformer are verified.

In particular, for both the primary side and the secondary side, the system verifies the polarity based on the common connection node (e.g., the common connection nodes 112 of FIG. 1A) are closest to the electronic sensor device based on the first primary node (e.g., the H1 node) of each current transformer being the most distant from the power transformer and the electronic sensor device (e.g., with reference to the H2 node, where the H2 node is closest to the power transformer and the electronic sensor device). The common connection node can also be referred to as a starpoint.

For example, for a negative test result of a primary phase leg, the H1 node and the H2 node of the current transformer may be flipped. In this case, the second test current would flow from the first secondary node (e.g., the S1 node) to the common node connection and into the secondary node of the electronic sensor device and out of the primary node of the electronic sensor device, instead of into the primary node of the electronic sensor device and out of the secondary node of the electronic sensor device. Based on the current flowing out of the primary node instead of the secondary node, the system can determine the negative test result, and the system can determine that the common connection node is not facing the electronic sensor device (e.g., the current transformer is miswired).

In some other examples, for a negative test result of a primary phase leg, a user can swap the secondary phase leg with the primary phase leg, such that the secondary connections to the electronic sensor device are swapped. In some other examples, the user can change the pre-defined configuration of the electronic sensor device.

Therefore, the system allows for a comprehensive verification for polarity and wiring that test the connections between the current transformer itself and the protected device.

The tests may be performed by users entering values into test equipment. In particular, the tests may be performed based on a user placing the test equipment in a test mode, where the test equipment is used to inject current. The injected current can be of desired magnitude and known polarity, and the test equipment can inject the current for a particular amount of time. The results may be displayed to the users on display devices.

In particular, a user can perform the tests by coupling the first primary node H1 and the second primary H2 to a test equipment device for each primary phase leg of the primary side. For the secondary side, the user can couple the first primary node H1 and the first secondary node H2 to the test equipment device for each secondary phase leg. In some examples, the user can input values using an interface of the test equipment device to verify the polarity of the current transformers for the primary side and the secondary side.

For example, the user can input the values using the interface of the test equipment device to perform a hysteresis procedure by injecting the test current for a particular period of time. The particular period of time is equal for the primary side and the secondary side.

In particular, during operation of the current transformer, current creates a magnetic field as it flows through the primary side. The strength of the magnetic field can affect the magnetic dipoles of the current transformer (e.g., a core of the current transformer) by orienting the magnetic dipoles in a particular direction, which can affect magnetic flux and flux density of the current transformer, even after removing the current. The affected flux density results in remanence flux in the current transformer, which can saturate the current transformer and negatively impact testing of the current transformer. Therefore, when the user performs testing, the user can "degauss" and reduce the remanence flux of the current transformer by injecting a DC test current of opposite polarity for the particular period of time.

This specification uses the term "configured" in connection with systems and computer program components. For a system of one or more computers to be configured to perform particular operations or actions means that the system has installed on its software, firmware, hardware, or a combination of them that in operation cause the system to perform the operations or actions. For one or more computer programs to be configured to perform particular operations or actions means that the one or more programs include instructions that, when executed by data processing apparatus, cause the apparatus to perform the operations or actions.

Embodiments of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible storage medium, which may be non-transitory, for execution by, or to control the operation of, data processing apparatus. The computer storage medium can be a machine-readable storage device, a machine-readable storage substrate, a random or serial access memory device, or a combination of one or more of them. Alternatively, or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus.

The term "data processing apparatus" refers to data processing hardware and encompasses all kinds of apparatus, devices, and machines for processing data, including by way of example a programmable processor, a computer, or multiple processors or computers. The apparatus can also be, or further include, special purpose logic circuitry, e.g., an FPGA (field programmable gate array) or an ASIC (application-specific integrated circuit). The apparatus can optionally include, in addition to hardware, code that creates an execution environment for computer programs, e.g., code that constitutes processor firmware, a protocol stack, a database management system, an operating system, or a combination of one or more of them.

A computer program, which may also be referred to or described as a program, software, a software application, an app, a module, a software module, a script, or code, can be written in any form of programming language, including compiled or interpreted languages, or declarative or procedural languages; and it can be deployed in any form, including as a stand-alone program or as a module, component, subroutine, or other unit suitable for use in a computing environment. A program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A computer program can be deployed to be executed on one computer or on multiple computers that are located at one site or distributed across multiple sites and interconnected by a data communication network.

In this specification the term "engine" is used broadly to refer to a software-based system, subsystem, or process that is programmed to perform one or more specific functions. Generally, an engine will be implemented as one or more software modules or components, installed on one or more computers in one or more locations. In some cases, one or more computers will be dedicated to a particular engine; in other cases, multiple engines can be installed and running on the same computer or computers.

The processes and logic flows described in this specification can be performed by one or more programmable computers executing one or more computer programs to perform functions by operating on input data and generating output. The processes and logic flows can also be performed by special purpose logic circuitry, e.g., an FPGA or an ASIC, or by a combination of special purpose logic circuitry and one or more programmed computers.

Computers suitable for the execution of a computer program can be based on general or special purpose microprocessors or both, or any other kind of central processing unit. Generally, a central processing unit will receive instructions and data from a read-only memory or a random access memory or both. The essential elements of a computer are a central processing unit for performing or executing instructions and one or more memory devices for storing instructions and data. The central processing unit and the memory can be supplemented by, or incorporated in, special purpose logic circuitry. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

Computer-readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's device in response to requests received from the web browser. Also, a computer can interact with a user by sending text messages or other forms of message to a personal device, e.g., a smartphone that is running a messaging application, and receiving responsive messages from the user in return.

Data processing apparatus for implementing machine learning models can also include, for example, special-purpose hardware accelerator units for processing common and compute-intensive parts of machine learning training or production, i.e., inference, workloads.

Machine learning models can be implemented and deployed using a machine learning framework, e.g., a TensorFlow framework.

Embodiments of the subject matter described in this specification can be implemented in a computing system that includes a back-end component, e.g., as a data server, or that includes a middleware component, e.g., an application server, or that includes a front-end component, e.g., a client computer having a graphical user interface, a web browser, or an app through which a user can interact with an implementation of the subject matter described in this specification, or any combination of one or more such back-end, middleware, or front-end components. The components of the system can be interconnected by any form or medium of digital data communication, e.g., a communication network. Examples of communication networks include a local area network (LAN) and a wide area network (WAN), e.g., the Internet.

The computing system can include clients and servers. A client and server are generally remote from each other and typically interact through a communication network. The relationship of client and server arises by virtue of computer programs running on the respective computers and having a client-server relationship to each other. In some embodiments, a server transmits data, e.g., an HTML page, to a user device, e.g., for purposes of displaying data to and receiving user input from a user interacting with the device, which acts as a client. Data generated at the user device, e.g., a result of the user interaction, can be received at the server from the device.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially be claimed as such, one or more features from a claimed combination can in some cases be excised from the combination, and the claimed combination may be directed to a subcombination or variation of a subcombination.

Similarly, while operations are depicted in the drawings and recited in the claims in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A method of verifying current transformer polarity for one or more current transformers, wherein:

each of one or more phases of a protected device includes an input power leg, and each input power leg is coupled to an electronic sensor device by a respective current transformer;

each respective current transformer is associated with a first primary node H1, a second primary node H2, a first secondary node S1, and a second secondary node S2, wherein the first secondary node S1 and the second secondary node S2 are connected to respective first and second nodes of the electronic sensor device, and the second primary node H2 of the respective current transformer is adjacent an input of an input power leg of the protected device;

the method comprising:

for each input power leg of the protected device:

injecting a first test current into a first primary node H1 of the respective current transformer to induce a second test current in a first secondary node S1 of the respective current transformer;

determining a positive test result when the second test current i) flows into a first node of the electronic sensor device and flows out of a second node of the electronic sensor device and ii) flows into the second secondary node S2 of the respective current transformer; and determining a negative test result otherwise; and determining a polarity verification for each of the input power legs of the protected device when a positive test result is determined for each of the one or more input power legs of the protected device.

2. The method of claim 1, wherein the protected device is a power transformer and the input power leg is a primary phase leg, and the power transformer comprises a secondary phase leg, the method further comprising:

for each secondary phase leg of the power transformer:

injecting a third test current into the second primary node H2 of the respective current transformer to induce a fourth test current in a second secondary node S2 of the respective current transformer, wherein the second primary node H2 of the respective current transformer is adjacent an input of the secondary phase leg of the protected device;

determining a positive test result when the fourth test current i) flows into a third node of the electronic sensor device and flows out of a fourth node of the electronic sensor device and ii) flows into the first secondary node S1 of the respective current transformer; and determining a negative test result otherwise; and determining a polarity verification for the secondary phase leg of the power transformer when a positive test result is determined for each secondary phase leg of the power transformer.

3. The method of claim 2, wherein the second secondary node S2 of each of the current transformers coupled to a respective secondary phase leg of the power transformer are connected by a second common connection node.

4. The method of claim 1, wherein the electronic sensor device is a relay sensor.

5. The method of claim 1, wherein the second secondary node S2 of each of the current transformers coupled to a respective input power leg of the protected device are connected by a first common connection node.

6. The method of claim 1, further comprising:

presenting a result of the determined polarity verification to a user on a user device.

7. The method of claim 1, wherein injecting the test currents comprises:

for a primary side, coupling the first primary node H1 and the second primary node H2 to a test equipment device for each input power leg; and for a secondary side, coupling the first primary node H1 and the second primary node H2 to the test equipment device for each secondary phase leg.

8. The method of claim 7, wherein a user can input values using an interface of the test equipment device to verify the polarity of the current transformers for the primary side and the secondary side.

9. The method of claim 8, wherein the user can input the values using the interface of the test equipment device to perform a hysteresis procedure by injecting the test current for a particular period of time, wherein the particular period of time is equal for the primary side and the secondary side.

10. The method of claim 7, wherein the injected first test current is DC current.

11. The method of claim 1, wherein a user can perform degaussing of each current transformer by injecting another DC test current of opposite polarity for a particular period of time.

12. The method of claim 1, wherein a user can inject the test current using test equipment, wherein the test equipment is configured to generate a test current of a particular magnitude, a particular polarity, or both for a particular period of time.

13. A apparatus comprising:

a processing device; and one or more storage devices storing instructions that are operable by the processing device and that upon such operation cause the processing device to determine a polarity verification of current transformer for a protected device, wherein:

each of one or more phases of the protected device includes an input power leg, and each input power leg is coupled to an electronic sensor device by a respective current transformer;

each respective current transformer is associated with a first primary node H1, a second primary node H2, a first secondary node S1, and a second secondary node S2, wherein the first secondary node S1 and the second secondary node S2 are connected to respective first and second nodes of the electronic sensor device, and the second primary node H2 of the respective current transformer is adjacent an input of an input power leg of the protected device;

wherein the determining the polarity verification comprises the operations of:

for each input power leg of the protected device:

monitoring the injection of a first test current into a first primary node H1 of the respective current transformer that induces a second test current in a first secondary node S1 of the respective current transformer;

monitoring the second test current;

determining a positive test result when the second test current i) flows into a first node of the electronic sensor device and flows out of a second node of the electronic sensor device and ii) flows into the second secondary node S2 of the respective current transformer; and determining a negative test result otherwise; and determining a polarity verification for each of the input power legs of the protected device when a positive test result is determined for each of the one or more input power legs of the protected device.

14. The apparatus of claim 13, wherein the protected device is a power transformer and the input power leg is a primary phase leg, and the power transformer comprises a secondary phase leg, the operations further comprising:

for each secondary phase leg of the power transformer:

monitoring the injection of a third test current into the second primary node H2 of the respective current transformer to induce a fourth test current in a second secondary node S2 of the respective current transformer, wherein the second primary node H2 of the respective current transformer is adjacent an input of the secondary phase leg of the protected device;

monitoring the fourth test current;

determining a positive test result when the fourth test current i) flows into a third node of the electronic sensor device and flows out of a fourth node of the electronic sensor device and ii) flows into the first secondary node S1 of the respective current transformer; and determining a negative test result otherwise; and determining a polarity verification for the secondary phase leg of the power transformer when a positive test result is determined for each secondary phase leg of the power transformer.

15. The apparatus of claim 14, wherein the second secondary node S2 of each of the current transformers coupled to a respective secondary phase leg of the power transformer are connected by a second common connection node.

16. The apparatus of claim 13, wherein the electronic sensor device is a relay sensor.

17. The apparatus of claim 13, wherein the second secondary node S2 of each of the current transformers coupled to a respective input power leg of the protected device are connected by a first common connection node.

18. The apparatus of claim 13, the operations further comprising:

presenting a result of the determined polarity verification to a user on a user device.

19. One or more computer storage media storing instructions that when executed by one or more computers cause the one or more devices to the processing device to determining a polarity verification of current transformer for a protected device, wherein:

each of one or more phases of the protected device includes an input power leg, and each input power leg is coupled to an electronic sensor device by a respective current transformer;

each respective current transformer is associated with a first primary node H1, a second primary node H2, a first secondary node S1, and a second secondary node S2, wherein the first secondary node S1 and the second secondary node S2 are connected to respective first and second nodes of the electronic sensor device, and the second primary node H2 of the respective current transformer is adjacent an input of an input power leg of the protected device;

wherein the determining the polarity verification comprises the operations of:

for each input power leg of the protected device:

monitoring the injection of a first test current into a first primary node H1 of the respective current transformer that induces a second test current in a first secondary node S1 of the respective current transformer;

monitoring the second test current;

determining a positive test result when the second test current i) flows into a first node of the electronic sensor device and flows out of a second node of the electronic sensor device and ii) flows into the second secondary node S2 of the respective current transformer; and determining a negative test result otherwise; and determining a polarity verification for each of the input power legs of the protected device when a positive test result is determined for each of the one or more input power legs of the protected device.

20. The one or more computer storage media storing instructions of claim 19, wherein the protected device is a power transformer and the input power leg is a primary phase leg, and the power transformer comprises a secondary phase leg, the operations further comprising:

for each secondary phase leg of the power transformer:

monitoring the injection of a third test current into the second primary node H2 of the respective current transformer to induce a fourth test current in a second secondary node S2 of the respective current transformer, wherein the second primary node H2 of the respective current transformer is adjacent an input of the secondary phase leg of the protected device;

monitoring the fourth test current;

determining a positive test result when the fourth test current i) flows into a third node of the electronic sensor device and flows out of a fourth node of the electronic sensor device and ii) flows into the first secondary node S1 of the respective current transformer; and determining a negative test result otherwise; and determining a polarity verification for the secondary phase leg of the power transformer when a positive test result is determined for each secondary phase leg of the power transformer.

* * * * *